United States Patent [19]

Okanobu

[11] Patent Number: 4,560,920
[45] Date of Patent: Dec. 24, 1985

[54] VOLTAGE TO CURRENT CONVERTING CIRCUIT

[75] Inventor: Taiwa Okanobu, Tokyo, Japan

[73] Assignee: Sony Corporation, Tokyo, Japan

[21] Appl. No.: 614,318

[22] Filed: May 25, 1984

[30] Foreign Application Priority Data

May 30, 1983 [JP] Japan ................................ 58-95355

[51] Int. Cl.$^4$ .............................................. G05F 3/08
[52] U.S. Cl. .................................. 323/315; 323/316; 330/288
[58] Field of Search ................ 323/315, 316; 330/257, 330/288; 307/494

[56] References Cited

U.S. PATENT DOCUMENTS

4,338,527  7/1982  Nagano ............................. 330/257
4,354,122  10/1982  Embree et al. ..................... 323/316

FOREIGN PATENT DOCUMENTS

4905    1/1981  Japan ................................ 330/257
12112   2/1981  Japan ................................ 330/288

OTHER PUBLICATIONS

Ashok et al., "Non-Inverting Op-Amp Circuits Using Current Mirrors," Electronic Eng., Sep. 1978, p. 19.
Vojnovic, "Accurate Voltage-Controlled Constant-Current Source," New Electron. (G.B.), vol. 11, No. 4, p. 23, Feb. 21, 1978.
RCA Technical Note No. 1242, Robert Amantea, "Voltage-to-Current Converter," 3 Sheets, May 28, 1980.

*Primary Examiner*—William H. Beha, Jr.
*Attorney, Agent, or Firm*—Lewis H. Eslinger; Alvin Sinderbrand

[57] ABSTRACT

A voltage to current converting circuit can operate at low voltages and throughout a high range of voltages without distortion of the output signal current. An input-output current mirror circuit has a current input transistor and a current output transistor having their bases connected. The collector of the current input transistor is connected to an input resistor which accepts the input signal voltage. The collector of the current input transistor is also connected to the bases of the current input and output transistors through a non-inverting current amplifier having a low input impedance. The collector of the current input transistor is further connected to a source of a constant DC reference current I having a high output impedance. The input signal voltage e is converted to a current signal by the input resistor and applied to the collector of the current input transistor. The resulting current $I-i$ which appears at the collector of the current output transistor is used by an output circuit to develop a first output signal of $I-i$. The output circuit also generates an intermediate current of $2I$ and provides a second output signal of $I+i$ obtained by subtracting $I-i$ from the intermediate current $2I$.

20 Claims, 5 Drawing Figures

VOLTAGE TO CURRENT CONVERTING CIRCUIT

BACKGROUND OF THE INVENTION

1. Field of the Invention

The present invention relates to a voltage to current converting circuit and, more particularly, to a voltage to current converting circuit capable of operation over a wide range with low distortion and low power requirements.

2. Description of the Prior Art

A typical voltage to current converting circuit uses a differential amplifier to convert a signal voltage e into a balanced signal current.

One such prior art circuit simply connects the ends of the signal source to the inputs of a differential amplifier and takes the current in one of the outputs of the amplifier as the signal current. This circuit is only useful for signal voltages having a maximum range of 10 mv. Signals with voltages having a greater range cause distortion of the output signal that is unacceptable for most applications.

One solution to that problem uses one or more current sources and resistors connected to the emitters of the differential amplifier transistors. The maximum range of the circuit is increased, but so is the power required for its operation.

SUMMARY OF THE INVENTION

It is an object of the present invention to provide a voltage to current converting circuit that overcomes the shortcomings of the prior art.

It is another object of the present invention to provide a voltage to current converting circuit that is capable of handling an input signal with a wide range while having low power requirements.

It is a further object of the present invention to provide such a voltage to current converting circuit that can be fabricated as an integrated circuit.

In accordance with an aspect of the present invention, a voltage to current converting circuit for converting an input signal voltage at an input terminal into an output signal current comprises input-output current mirror means including a current input transistor and at least one current output transistor having the base thereof connected to the base of the current input transistor and the collector thereof being an output for connection to an output means for developing the output signal current, and an input resistor connected between the input terminal and the collector of the current input transistor. A noninverting current amplifier has an input connected to the collector of the current input transistor and an output connected to the bases of the current input and output transistors. A constant reference current source is connected to the collector of the current input transistor for providing a substantially constant reference current thereto.

Those and other objects, features and advantages of the present invention will be apparent from the detailed description of preferred embodiments of the invention, which follows.

DETAILED DESCRIPTION OF PREFERRED EMBODIMENTS

The present invention will be better understood by first gaining an appreciation of the shortcomings of known voltage to current converting circuits.

Figure 1:
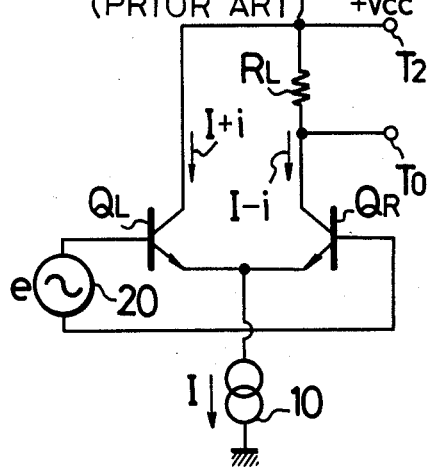
FIG. 1 is a schematic representation of one prior art voltage to current converting circuit.

FIG. 1 shows a simple voltage to current converting circuit that can be fabricated as or part of an integrated circuit. The converting circuit includes differentially connected bipolar transistors $Q_R$ and $Q_L$. The commonly connected emitters of the transistors $Q_R$ and $Q_L$ are connected to a constant current source 10 that provides a current I. The base of the transistor $Q_L$ receives one end of a signal source 20 and the base of the transistor $Q_R$ receives the other end of the signal source 20. The signal source 20 provides an input signal voltage e. The collectors of the transistors $Q_R$ and $Q_L$ are connected to a reference potential $+V_{cc}$ at a reference terminal $T_2$. A load resistor $R_L$ is connected between the collector of the transistor $Q_R$ and the reference terminal $T_2$. An output terminal $T_0$ is located between the collector of the transistor $Q_R$ and the load resistor $R_L$. An output signal current $I-i$ appears at the output terminal $T_0$ in accordance with the input signal voltage e.

The principal shortcoming of the converting circuit of FIG. 1 is in the small range of variation in the input signal voltage e that it can tolerate. If the potential of the signal e varies more than 10 mV, the output signal current will be distorted. Thus, the circuit shown in FIG. 1 is suitable only for input signals having a small range.

Figure 2:
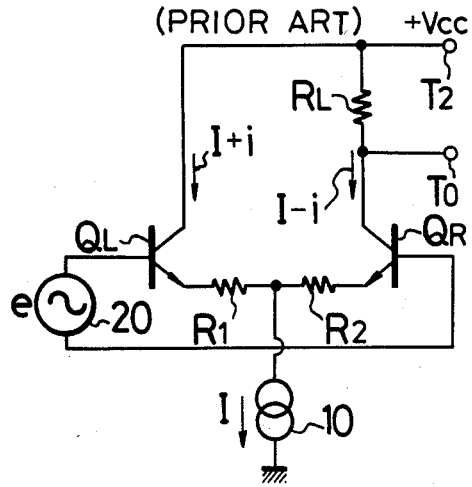
FIG. 2 is a schematic representation of a second prior art voltage to current converting circuit.
Figure 3:
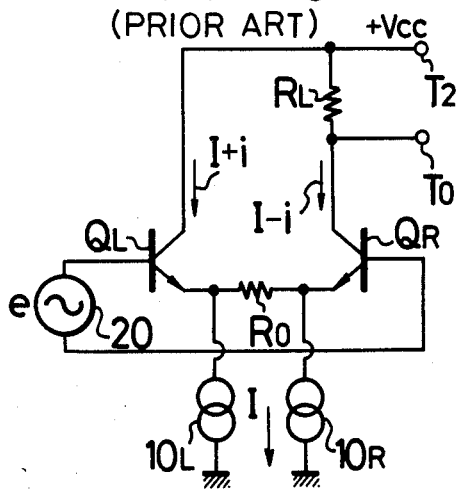
FIG. 3 is a schematic representation of a third prior art voltage to current converting circuit.

The prior art converting circuits shown in FIGS. 2 and 3 have been proposed to solve that particular problem. They include the same elements as the converting circuits shown in FIG. 1. However, they also include, in the case of FIG. 2, two emitter resistors $R_1$ and $R_2$ connected between the current source 10 and, respectively, the emitters of the transistors $Q_L$ and $Q_R$. In FIG. 3, two current sources $10_L$ and $10_R$ are connected directly to the emitters of the transistors $Q_L$ and $Q_R$, respectively. A resistor $R_0$ is connected between the emitters of the transistors $Q_L$ and $Q_R$.

With the differential amplifiers shown in FIGS. 2 and 3, distortion in the output signal current will be eliminated if the DC and AC potentials across the emitter resistors, either $R_0$, or $R_1$ and $R_2$, are maintained at levels exceeding the input signal voltage e. For example, if the circuit is to handle input signal voltages up to twice the peak-to-peak voltage, then the potentials at the collectors of the transistors $Q_R$ and $Q_L$ must be at least 2.5 volts. In that case the circuit component that is to use the output signal current must then have a power source that supplies a voltage of at least 3 volts. Therefore, although they provide a distortion-free output signal throughout a higher range of input signals, the circuits shown in FIGS. 2 and 3 require relatively high voltages for operation.

Figure 4:
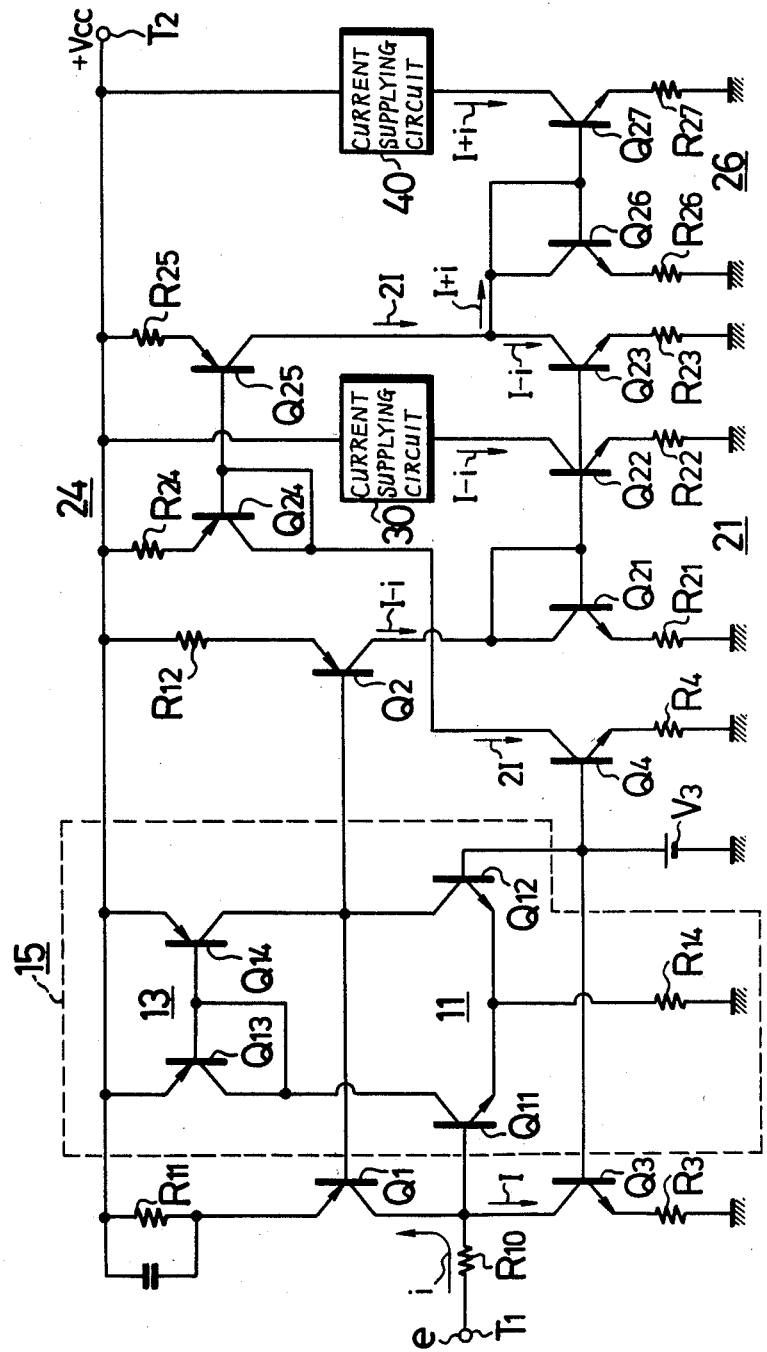
FIG. 4 is a schematic representation of a voltage to current converting circuit in accordance with an embodiment of the present invention.

FIG. 4 depicts a voltage to current converting circuit in accordance with the present invention. The circuit in FIG. 4 comprises a current input transistor $Q_1$ and a current output transistor $Q_2$ that have their bases connected together. The emitters of the transistors $Q_1$ and $Q_2$ are connected to a reference terminal $T_2$ so as to have a reference potential $+V_{cc}$ applied thereto. The collector of the current input transistor $Q_1$ is connected to the input terminal $T_1$, which receives the input signal e, and to a reference-current transistor $Q_3$. The base of the referencecurrent transistor $Q_3$ is connected to the base of an intermediate-current transistor $Q_4$. The commonly connected bases of the transistors $Q_3$ and $Q_4$ are connected to a DC bias voltage source $V_3$. The emitters of the transistors $Q_3$ and $Q_4$ are connected to ground through reference-current and intermediate-current resistors $R_3$ and $R_4$, respectively. The emitters of the transistors $Q_3$ and $Q_4$ thus are disposed to have reference potentials applied thereto depending on the resistors $R_3$ and $R_4$.

As shown in FIG. 4, the collectors of the transistors $Q_1$ and $Q_3$ receive the input signal voltage e through an input resistor $R_{10}$. A resistor $R_{11}$ is connected between the transistor $Q_1$ and the reference terminal $T_2$ and a capacitor is connected as shown in FIG. 4 in parallel with the resistor $R_{11}$ to damp oscillations at the collector of the transistor $Q_1$. A resistor $R_{12}$ is connected between the reference terminal $T_2$ and the collector of the transistor $Q_2$.

A differential amplifier 11, an equalizing current mirror 13 and a resistor $R_{14}$ are connected as shown to construct a non-inverting current amplifier 15. More particularly, the differential amplifier 11 comprises an amplifier input transistor $Q_{11}$ having its emitter connected to the emitter of an amplifier output transistor $Q_{12}$. The commonly connected emitters of the transistors $Q_{11}$ and $Q_{12}$ are grounded through the amplifier resistor $R_{14}$. It will be understood throughout this description that the connections to ground can be made through a single ground terminal, although for the sake of clarity, FIG. 4 shows a plurality of individual connections to ground. The collectors of the amplifier transistors $Q_{11}$ and $Q_{12}$ are connected to the collectors of the equalizing input and output transistors $Q_{13}$ and $Q_{14}$, respectively. The emitters of the transistors $Q_{13}$ and $Q_{14}$ are connected to the reference terminal $T_2$ and the bases of the transistors $Q_{13}$ and $Q_{14}$ are connected. The collector of the transistor $Q_{13}$ is connected to its base so that the transistor $Q_{13}$ comprises the input transistor of the equalizing current mirror 13. As is well known, if the input and output transistors $Q_{13}$ and $Q_{14}$ of the current mirror 13 are complementary, that is, have the same effective emitter area, then the collector currents of the transistors $Q_{13}$ and $Q_{14}$ will differ only by the negligible amount $2I_B$ 'the base current of the transistors'. In any event, the commonly connected collectors of the transistors $Q_{12}$ and $Q_{14}$ are connected to the commonly connected bases of the current input and output transistors $Q_1$ and $Q_2$.

Figure 5:
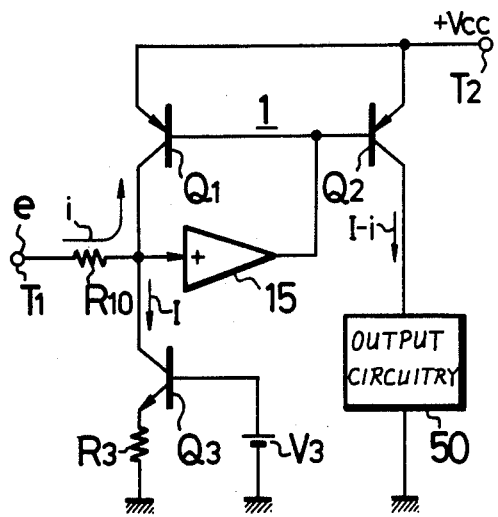
FIG. 5 depicts elements of the circuit shown in FIG. 4 as their functional equivalents.

FIG. 5 depicts schematically functional equivalents of portions of the circuit shown in FIG. 4 which have thus far been described. The current input and output transistors $Q_1$ and $Q_2$ comprise an input-output current mirror means 1 in which the base and collector of the input transistor, here the current input transistor $Q_1$, are connected through a non-inverting current amplifier 15. Or, if that connection is considered in relation to the amplifier 15, the amplifier 15 is connected with 100% negative current feed-back. The input impedance of the amplifier 15 is thus negligible relative to the resistance $r_{10}$ the input resistance $R_{10}$ and can be disregarded.

The resistors $R_3$ and $R_4$ are provided with properties such that if the DC current at the collector of the reference-current transistor $Q_3$ is I, the DC current at the collector of the intermediate-current transistor $Q_4$ is 2I. The transistor $Q_3$ thus functions as a constant reference current source and the output impedance at its collector is relatively high. Thus, the current at the collector of the input transistor $Q_1$ is $I-i$, where i is the current through the input resistor $R_{10}$, as shown in FIG. 4. Because transistors $Q_1$ and $Q_2$ are connected in the inputoutput current mirror means 1, the collector current at the current output transistor $Q_2$ is also $I-i$. The collector of that transistor is thus an output that provides a current to an output circuit to generate a balanced output signal of $I+i$ and $I-i$.

The output circuit shown in FIG. 5 represents various components in FIG. 4. In particular, the various current mirrors 21, 24 and 26 and the first and second current supplying circuits 30 and 40 comprise an output stage of the output means 50 represented schematically in FIG. 5. As will be apparent as this description proceeds, the output means also can be considered to include the intermediate-current source comprised of the transistor $Q_4$ and the resistor $R_4$.

A primary current mirror means 21 includes a transistor $Q_{21}$ as a primary input transistor. The primary current mirror 21 also includes a primary output transistor $Q_{22}$ and a secondary output transistor $Q_{23}$, which have their bases connected to the base of the transistor $Q_{21}$, and the resistors $R_{21}$, $R_{22}$ and $R_{23}$ connect the respective emitters of the transistors $Q_{21}$, $Q_{22}$ and $Q_{23}$ to ground. The bases of the transistors $Q_{21}$, $Q_{22}$ and $Q_{23}$ are connected to the collector of the primary input transistor $Q_{21}$.

A feeding current mirror means 24 includes a feeding input transistor $Q_{24}$ that has its base and collector connected. The collector of the transistor $Q_{24}$ is also connected to the collector of the intermediate-current transistor $Q_4$. A feeding output transistor $Q_{25}$ has its base connected to the base of the transistor $Q_{24}$ and its collector connected to the collector of the secondary output transistor $Q_{23}$. The emitters of the feeding transistors $Q_{24}$ and $Q_{25}$ are connected through resistors $R_{24}$ and $R_{25}$, respectively, to the reference terminal $T_2$.

A subtracting current mirror means 26 comprises a subtracting input transistor $Q_{26}$ that has its collector connected to the collectors of the transistors $Q_{23}$ and $Q_{25}$ and to its base. The base of the transistor $Q_{26}$ is connected to the base of a subtracting output transistor $Q_{27}$. The emitters of the transistors $Q_{26}$ and $Q_{27}$ are connected to ground through the resistors $R_{26}$ and $R_{27}$, respectively.

A first current supplying circuit 30 is connected between the reference terminal $T_2$ and the collector of the primary output transistor $Q_{22}$. A second current supplying circuit 40 is connected between the reference terminal $T_2$ and the collector of the subtracting output transistor $Q_{27}$. The current supplying circuits supply the output current signal to the circuit that is going to use it.

The voltage to current converting circuit provides first and second outputs $I+i$ and $I-i$ as follows. As previously described, the current $I-i$ flows in the collector of the transistor $Q_2$ when an input signal e is present at the input terminal $T_1$. That current $I-i$ thus also flows in the collector of the transistor $Q_{21}$ and thus in the collectors of the transistors $Q_{22}$ and $Q_{23}$. The collector of the primary output transistor $Q_{22}$ provides that current as the first output to the first current supplying circuit 30. From the circuit 30, the first output can be provided to another circuit.

The current supplying circuits 30 and 40 are provided as shown in FIG. 4 when the voltage to current converting circuit is fabricated as an integrated circuit. By connecting them to the reference terminal and making them part of the same integrated circuit, the entire integrated voltage to current converting circuit is more easily and conveniently connected to the apparatus that is to utilize its outputs. Of course, the outputs could be taken directly at the collectors of the transistors $Q_{22}$ and $Q_{27}$ and the circuits 30 and 40 could be omitted.

It will also be recalled that, because of the values of the resistors $R_3$ and $R_4$, the current $2I$ is present at the collector of the transistor $Q_4$. The feeding current mirror 24 provides that same current in the collector of the secondary output transistor $Q_{25}$. Since the current $I-i$ is present at the collector of the transistor $Q_{23}$, the current $I+i$ [$2I-(I-i)$] is present at the collector of the transistor $Q_{26}$. Thus, the current $I+i$ is present at the collector of the subtracting output transistor $Q_{27}$. The collector of the subtracting output transistor $Q_{27}$ provides that current to the current supplying circuit 40.

In accordance with the present invention the current $i$ is given by the equation $i=e/r10$, and thus the input signal voltage $e$ can be increased arbitrarily. Furthermore, since the amplifier 15 has 100% negative feedback, distortion in the output current is extremely low.

Moreover, the input voltage $e$ is converted to the signal current $i$ by the resistor $R_{10}$. The operation of the voltage to current converting circuit of the present invention does not depend on the value of the predetermined reference potential $+V_{cc}$. Experiments have shown that the present invention operates satisfactorily with the bias voltage provided by the source $V_3=1$ volt and the predetermined reference potential $+V_{cc}$ applied to the terminal $T_2$ at 1.8 volts.

It is also possible with the present invention to increase the number of output stages. Additional output transistors for the current mirrors 21 and 26, additional feeding current mirrors 24 and current supplying circuits 30 and 40 can be provided to generate additional outputs. It is also possible to provide additional current output transistors connected to the base of the transistor $Q_2$ when additional outputs are desired. The configuration of the present invention also permits fabrication of the entire circuit as an integrated circuit with the desired number of output stages. In addition, maxiumum flexibility is possible because the current generating portion of the circuit can be fabricated as one integrated circuit with the capability of accepting different output stage configurations also formed as integrated circuits.

The present invention thus provides a voltage to current converting circuit that can convert input signal voltage $e$ into an output signal current over a large range of input voltages, including low voltages, without distortion, and which is capable of having as many outputs as are required for a particular application.

Although a specific embodiment of the invention has been described in detail herein with reference to the accompanying drawings, it is to be understood that the invention is not limited to that embodiment, and that various changes and modifications other than those specifically mentioned can be effected therein by one skilled in the art without departing from the scope or spirit of the invention as defined in the appended claims.

What is claimed is:

1. A voltage to current converting circuit for converting an input signal voltage at an input terminal into an output signal current, the circuit comprising:
   input-output current mirror means including a current input transistor and at least one current output transistor having the base thereof connected to the base of said current input transistor and the collector thereof being an output for connection to an output means for developing the output signal current;
   input resistor means connected between the input terminal and the collector of said current input transistor;
   non-inverting current amplifier means having an input connected to the collector of said current input transistor and an output connected to the bases of said current input and output transistors; and
   a constant reference current source connected to the collector of said current input transistor for providing a substantially constant reference current thereto.

2. A voltage to current converting circuit as in claim 1; wherein said non-inverting current amplifier means includes:
   a differential amplifier having an amplifier input transistor with the base thereof connected to the collector of said current input transistor and an amplifier output transistor having the collector thereof connected to the bases of said current input and output transistors; and
   equalizing current mirror means having the input and output thereof each connected to the collector of one of said amplifier input and output transistors.

3. A voltage to current converting circuit as in claim 2; wherein:
   said equalizing current mirror means includes an equalizing input transistor and an equalizing output transistor having the bases thereof connected to each other and to the collector of said equalizing input transistor and the emitters thereof disposed for accepting a reference potential; and
   said amplifier input and output transistors have the collectors thereof connected to the collectors of said equalizing input and output transistors, respectively.

4. A voltage to current converting circuit as in claim 1; wherein said constant reference current source includes a reference-current transistor having the collector thereof connected to the collector of said current input transistor, the base thereof disposed for accepting a DC bias voltage and the emitter thereof disposed for accepting a reference potential.

5. A voltage to current converting circuit as in claim 4; wherein said non-inverting current amplifier means includes:
   a differential amplifier including amplifier input and output transistors having the emitters thereof connected and disposed for accepting a reference potential, the base of said amplifier input transistor connected to the collector of said current input transistor and the collector of said amplifier output transistor connected to the bases of said current input and output transistors; and
   equalizing current mirror means including an equalizing input transistor and an equalizing output transistor having the bases thereof connected together and to the collector of said equalizing input transistor, the emitters thereof disposed for accepting a reference potential and the collectors thereof connected, respectively, to the collectors of said amplifier input and output transistors.

6. A voltage to current converting circuit as in claim 5; wherein the base of said amplifier output transistor is disposed for accepting the DC bias voltage.

7. A voltage to current converting circuit as in claim 6; further comprising a reference terminal for accepting a predetermined reference potential and a ground terminal for connection to ground, wherein:
the emitters of said current input and output transistors and the emitters of said equalizing input and output transistors are connected to said reference terminal;
the emitters of said amplifier input and output transistors are connected to said ground terminal through amplifier resistance means; and
the emitter of said reference-current transistor is connected to said ground terminal through reference-current resistance means.

8. A voltage to current converting circuit as in claim 7; wherein said predetermined reference potential is about 1.8 volts and the DC bias voltage is about 1 volt.

9. A voltage to current converting circuit as in claim 1; wherein said non-inverting current amplifier presents a low input impedance relative to said input resistor means and said constant reference current source presents a high output impedance relative to said input resistor means.

10. A voltage to current converting circuit as in claim 1; further comprising output means including:
a constant intermediate current source for providing a substantially constant intermediate current at a level substantially equal to twice the reference current; and
an output stage for providing as a first output the current at the collector of said output transistor and as a second output the difference between the intermediate current and the first output.

11. A voltage to current converting circuit as in claim 10; wherein:
said constant reference current source includes a reference-current transistor having the collector thereof connected to the collector of said input transistor and the emitter thereof disposed for accepting a reference potential; and
said constant intermediate current source includes an intermediate-current transistor having the base thereof connected to the base of said reference-current transistor and disposed for accepting a DC bias voltage and the emitter thereof disposed for accepting a reference potential.

12. A voltage to current converting circuit as in claim 11; further comprising a ground terminal, wherein:
the emitter of said reference-current transistor is connected to said ground terminal through a reference-current resistor; and
the emitter of said intermediate-current transistor is connected to ground through an intermediate-current resistor.

13. A voltage to current converting circuit as in claim 12; wherein said output stage includes:
primary current mirror means having a primary input transistor with the collector thereof connected to the base thereof and to the collector of said current output transistor, at least one primary output transistor having the base thereof connected to the base of said primary input transistor for providing the first output at the collector thereof and a secondary output transistor having the base thereof connected to the base of said primary input transistor; and
subtracting current mirror means having a subtracting input transistor with the collector thereof connected to the base thereof and being disposed for receiving the first output and the intermediate current and having at least one subtracting output transistor having the base thereof connected to the base of said subtracting stage input transistor for providing the second output at the collector thereof.

14. A voltage to current converting circuit as in claim 13; wherein said primary current mirror means includes a plurality of primary output transistors and said subtracting current mirror means includes a plurality of primary output transistors and said subtracting current mirror means includes a plurality of subtracting output transistors.

15. A voltage to current converting circuit as in claim 13; wherein said output stage further includes a first current supplying means connected to the collector of said primary output transistor and a second current supplying means connected to the collector of said subtracting output transistor.

16. A voltage to current converting circuit as in claim 15; wherein said output stage further includes feeding current mirror means having a feeding input transistor with the collector thereof connected to base thereof and to the collector of said intermediate-current transistor and a feeding output transistor with the base thereof connected to the base of said feeding input transistor and the collector thereof connected to the collectors of said secondary output transistor and said subtracting input transistor.

17. A voltage to current converting circuit as in claim 16; further comprising a reference terminal for accepting a predetermined reference potential and a ground terminal, wherein:
the emitters of current input and output transistors, the emitters of said feeding-mirror input and output transistors and said first and second current supplying means are connected to said reference terminal; and
the emitters of said reference-current and intermediate-current transistors, said primary input and output transistors, said secondary output transistor and said subtracting input and output transistors are connected to said ground terminal through respective resistance means.

18. A voltage to current converting circuit as in claim 17; wherein said non-inverting current amplifier includes:
a differential amplifier having amplifier input and amplifier output transistors with the emitters thereof connected to said ground terminal through amplifier resistance means, the base of said amplifier input transistor connected to the collector of said current input transistor, the collector of said amplifier output transistor connected to the bases of said current input and output transistors, and the base of said differential output transistor disposed for accepting the DC bias voltage; and
equalizing current mirror means including an equalizing input transistor and an equalizing output transistor having the bases thereof connected to the collector of said equalizing input transistor, the emitters thereof connected to said reference terminal and the collectors thereof connected, respectively, to the collectors of said amplifier input and output transistors.

19. A voltage to current converting circuit as in claim 18; wherein said predetermined reference potential is about 1.8 volts and said DC bias voltage is about 1 volt.

20. A voltage to current converting circuit is in claim 18; wherein said circuit comprises an integrated circuit.

* * * * *